United States Patent [19]
Haji

[11] Patent Number: 5,647,942
[45] Date of Patent: Jul. 15, 1997

[54] WIRE BONDING METHOD

[75] Inventor: Hiroshi Haji, Chikushino, Japan

[73] Assignee: Matsushita Electric Industrial Co., Ltd., Osaka, Japan

[21] Appl. No.: 311,276

[22] Filed: Sep. 23, 1994

[30] Foreign Application Priority Data

Sep. 29, 1993 [JP] Japan ................................ 5-267908

[51] Int. Cl.⁶ .................................................. B32B 31/00
[52] U.S. Cl. ................... 156/281; 156/322; 204/192.32; 437/190; 437/210; 437/246
[58] Field of Search ............................. 156/322, 281; 437/210, 209, 245, 246, 190; 204/192.32

[56] References Cited

U.S. PATENT DOCUMENTS

| | | |
|---|---|---|
| 4,188,438 | 2/1980 | Burns . |
| 4,754,317 | 6/1988 | Comstock et al. . |
| 4,902,551 | 2/1990 | Nakaso et al. ............... 156/281 X |
| 5,165,590 | 11/1992 | Cini et al. . |
| 5,341,980 | 8/1994 | Nishikawa et al. . |

*Primary Examiner*—David A. Simmons
*Assistant Examiner*—Paul M. Rivard
*Attorney, Agent, or Firm*—Watson Cole Stevens Davis, P.L.L.C.

[57] ABSTRACT

The wire bonding method of the present invention comprises a step of removing a thin surface layer of an electrode comprising a copper layer and a nickel layer formed on the surface of the copper layer and coated with gold on the surface, to thereby remove nickel hydroxide and nickel oxide present on the gold film and a step of electrically connecting a pad of a semiconductor chip fixed with a bonding agent on the substrate through an electrically conductive wire to the nickel hydroxide nickel oxide-eliminated electrode.

8 Claims, 8 Drawing Sheets

A GOLD BALL

C NICKEL HYDROXIDE LAYER

B PLATED GOLD FILM

WIRE BONDING METHOD

BACKGROUND OF THE INVENTION

The present invention relates to a wire bonding method which comprises electrically connecting pads of a semiconductor chip bonded to a substrate and electrodes on the substrate using an electrically-conductive wire and particularly, to a wire bonding method by which a bonding can be secured even when the thickness of a plated gold film of the electrodes provided on the substrate is thin.

For example, the wire bonding method has been widely employed which comprises forming electrodes on a substrate made of a glass epoxy as a base material, mounting semiconductor chips on the substrate and connecting the pads of the semiconductor chip with the electrodes through wires comprising a superfine gold wire.

The electrodes are formed by applying gold plating onto a copper base formed on the substrate. However, the gold plating is seldom applied directly onto the copper base, and in many cases, cheap nickel having a proper hardness is plated on the copper base for inhibition of the surface stain caused by diffusion of copper atoms. That is, the electrode has a three-layer structure consisting of a copper layer, a nickel layer and a gold film on the substrate.

It is necessary that after the electrode has been bonded to the wire, a sufficient bond strength is kept at the portion where the lower end of the wire and the electrode have been bonded. Hitherto, it has been experientially considered that the bond strength varies depending on the thickness of the gold film and the thickness of the gold film must be increased (for example, to more than 0.5 μm) in order to obtain a sufficient bond strength, but no exact cause therefor has been known. Therefore, practically the wire bonding has been carried out after forming a thick gold film to secure the sufficient bond strength.

However, there is the problem that the costs unavoidably increase when the wire bonding is effected with forming a thick gold film.

The present inventor has found the causes for occurrence of reduction in the bond strength.

SUMMARY OF THE INVENTION

The object of the present invention is to provide a wire bonding method according to which a sufficient bond strength can be obtained even when a wire is bonded to an electrode having a thin gold film.

The wire bonding method of the present invention comprises a step of removing the surface layer in a thin thickness from an electrode on a substrate, the electrode comprising a nickel layer which is formed on a copper layer and coated with gold on the surface, to thereby eliminate nickel hydroxide and nickel oxide present on the surface of the gold film and a step of electrically connecting the nickel hydroxide and nickel oxide-eliminated electrode through an electrically conductive wire to a pad of semiconductor chip fixed with a bonding agent on the substrate.

According to the above method, since the wire is bonded to the gold film after elimination of the nickel hydroxide and nickel oxide present on the surface of the gold film, the bonding area of the wire and the gold film increases and the wire can be bonded to the gold film with a sufficient bond strength.

DETAILED DESCRIPTION OF THE INVENTION

Prior to giving an explanation of examples of the present invention, on the basis of the data obtained by the present inventor, an explanation will be made on the problems encountered when the surface layer of the electrode is not removed.

Figure 8A:
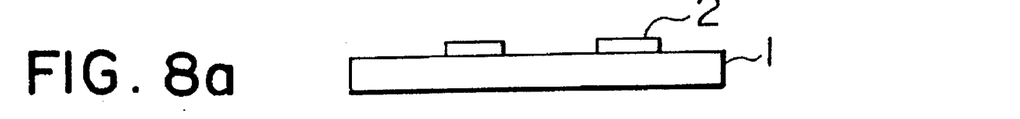
FIGS. 8a, 8b, 8c, 8d, 8e and 8f are a flowchart illustrating the steps of a conventional wire bonding method.
Figure 8B:
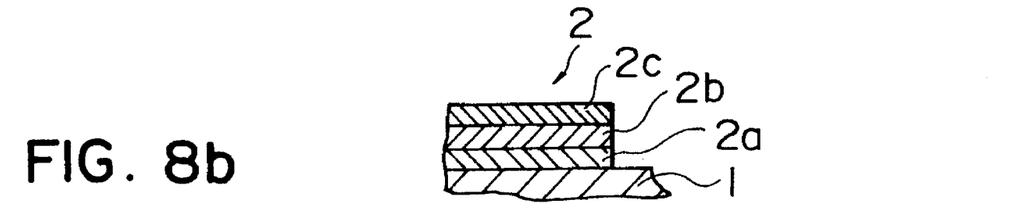
Figure 8C:
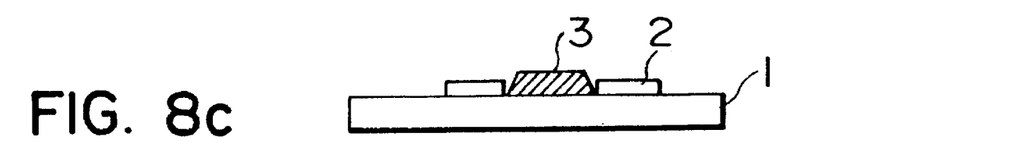
Figure 8D:
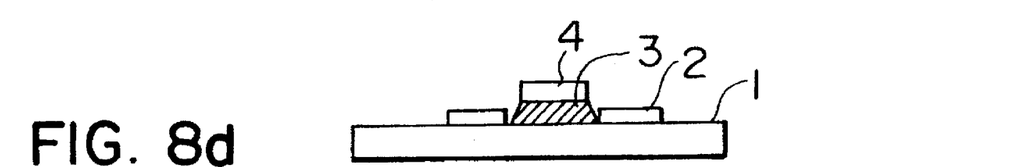
Figure 8E:
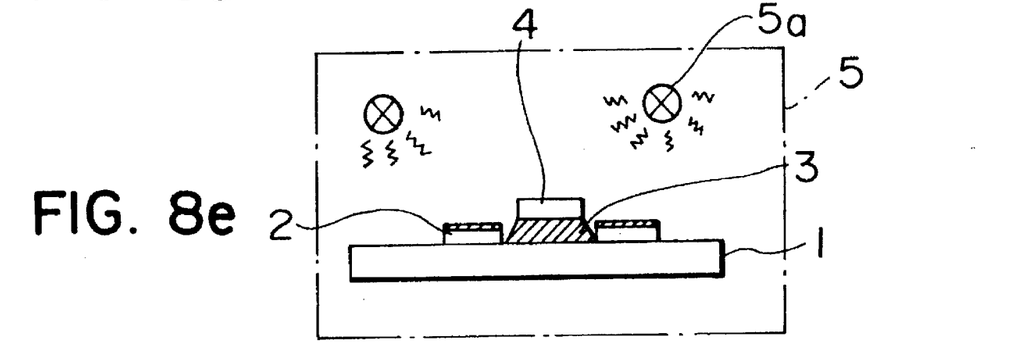
Figure 8F:
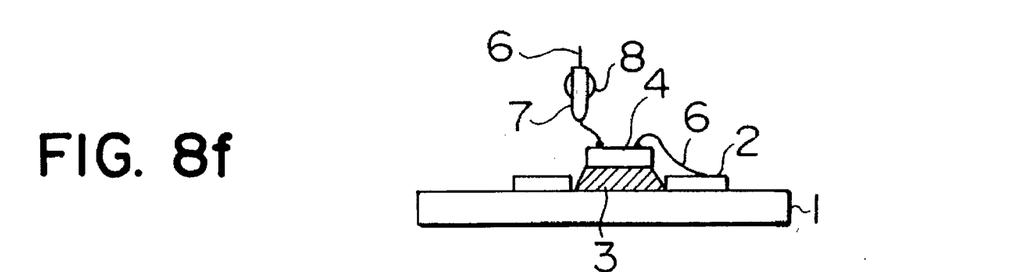

Hitherto, the process comprising from a step forming an electrode on a substrate up to a step of carrying out the wire bonding have been carried out as shown in FIG. 7 and FIGS. 8a, 8b, 8c, 8d, 8e and 8f. First, electrode 2 is formed on substrate 1 as shown in FIG. 8a. This electrode 2 comprises copper layer 2a, nickel layer 2b and gold film 2c as enlargedly shown in FIG. 8b. Then, as shown in FIG. 8c, adhesive 3 is coated on a given portion of the substrate 1 and semiconductor chip 4 is mounted on the adhesive 3 (FIG. 8d). The substrate 1 is heat treated in curing oven 5 to cure the adhesive 3 to thereby fix the semiconductor chip 4 to the substrate 1 (FIG. 8e). Reference numeral 5a indicates a heater. Next, the substrate 1 is taken out from the curing oven 5 and the electrode 2 and the semiconductor 4 are connected with wire 6 by a wire bonding apparatus (FIG. 8f). Reference numeral 7 indicates a capillary tool through which the wire 6 is passed, and reference numeral 8 indicates a horn which shakes the capillary tool 7.

Figure 9A:
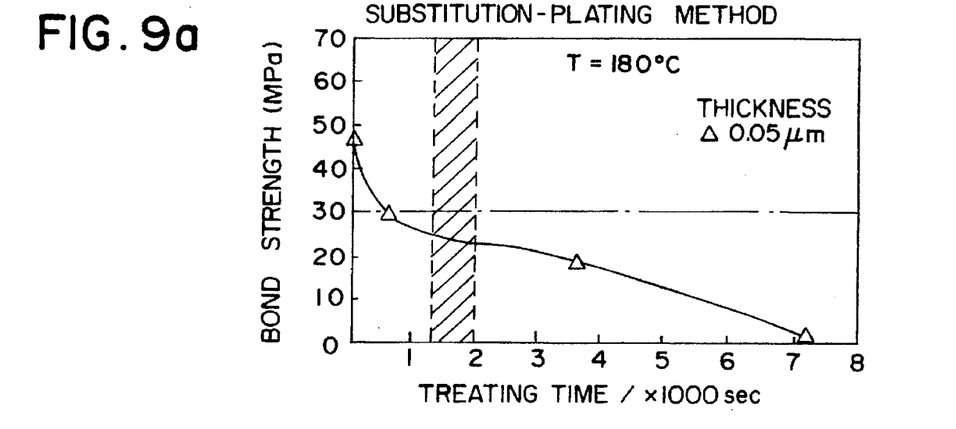
FIGS. 9a, 9b and 9c are graphs showing changes of the bond strength according to a conventional method.
Figure 9B:
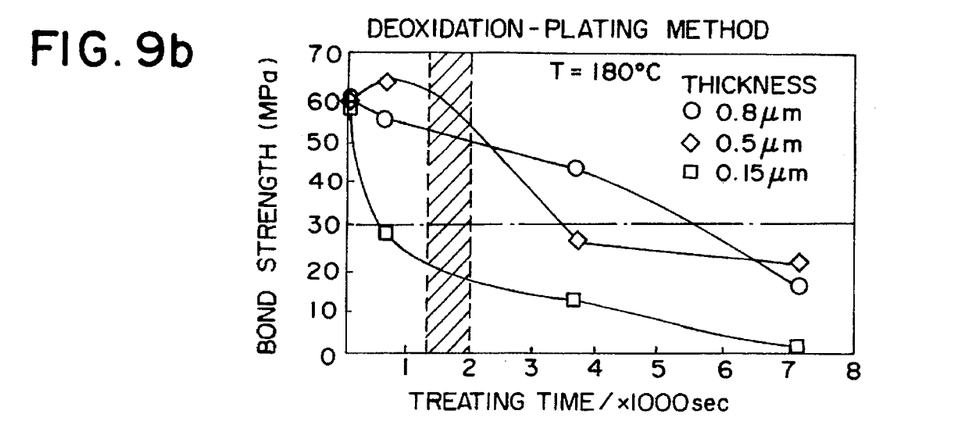
Figure 9C:
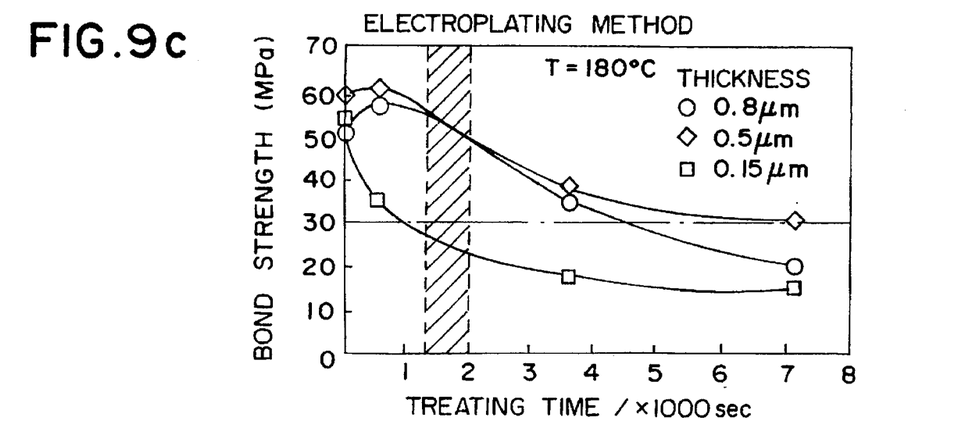

A substitution plating method, a deoxidation plating method and an electroplating method are known as methods for forming the gold film 2c. FIGS. 9a, 9b and 9c show the results of experiments conducted by the present inventor on the relation between the heat-treating time in the curing oven 5 and the bond strength at the bonding portion where the electrode 2 and the wire 6 were bonded by carrying out the wire bonding for the substrate 1 which was heat-treated for the heat-treating time, the experiments being carried out on the respective plating methods. The oblique line portion in FIGS. 9a–9c shows an practical heat treating time and the temperature T in the curing oven was 180° C. In these Figures the thickness means the thickness of gold film 2c and the bond strength at the above bonding portion is required to be about 30 MPa as shown by chain lines.

As shown in FIG. 9a, according to the substitution plating method, a super-thin gold film 2c (0.05 µm in thickness) was formed and a sufficient bond strength could be secured by carrying out the wire bonding with no heat-treatment. However, when the wire bonding was effected after subjected to the practical heat treatment, the bond strength decreased to lower than 30 MPa. Thus, according to the conventional substitution plating method, the bond strength of the bonding portion is insufficient and this method is unsuitable for formation of an electrode used for carrying out the wire bonding.

Next, as shown in FIGS. 9b or 9c, according to the deoxidation plating method or the electroplating method, when the wire bonding was carried out after the practical heat treatment for an electrode having a thin gold film 2c (0.15 µm in thickness), the bond strength was insufficient and these methods are unsuitable. However, if the gold film 2c was thick (0.5 µm or 0.8 µm in thickness), a sufficient bond strength could be secured even when the wire bonding was effected after the heat treatment. Accordingly, it has hitherto been considered that a thick gold film 2c must be formed by the deoxidation plating method or the electroplating method for forming an electrode in order to carry out the wire bonding. However, if the gold film is formed in such a large thickness, the costs increase as explained above for the prior art.

Figure 1:
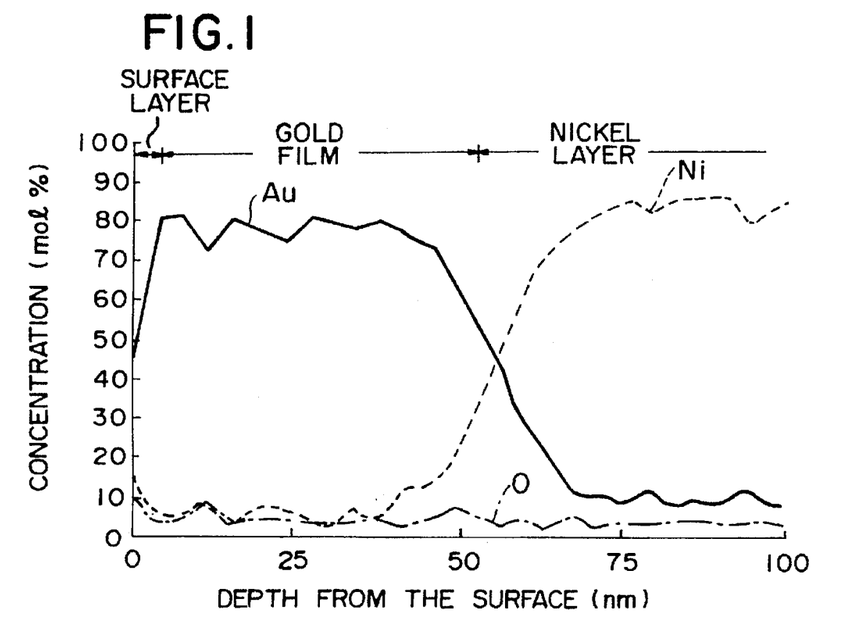
FIG. 1 is a graph showing a concentration distribution of gold, nickel and oxygen as a function of depth from the electrode surface according to one example of the present invention.

In order to know the influence of the difference in thickness of the gold film 2c, the present inventor obtained concentration distributions in the thickness direction of the electrode 2 (which has been subjected to the ordinary heat treatment) referred to in FIG. 9a. The results are as shown in FIG. 1. In FIG. 1, the solid line indicates the concentration of gold, the broken line indicates the concentration of nickel and the chain line indicates the concentration of oxygen. From FIG. 1, it has been ascertained that a part of nickel or its compound of the nickel layer diffuses into the gold film 2c. Furthermore, it has been found that the concentration of nickel or its compounds increase in the surface layer of the gold film 2c which is the bonding portion.

Figure 2:
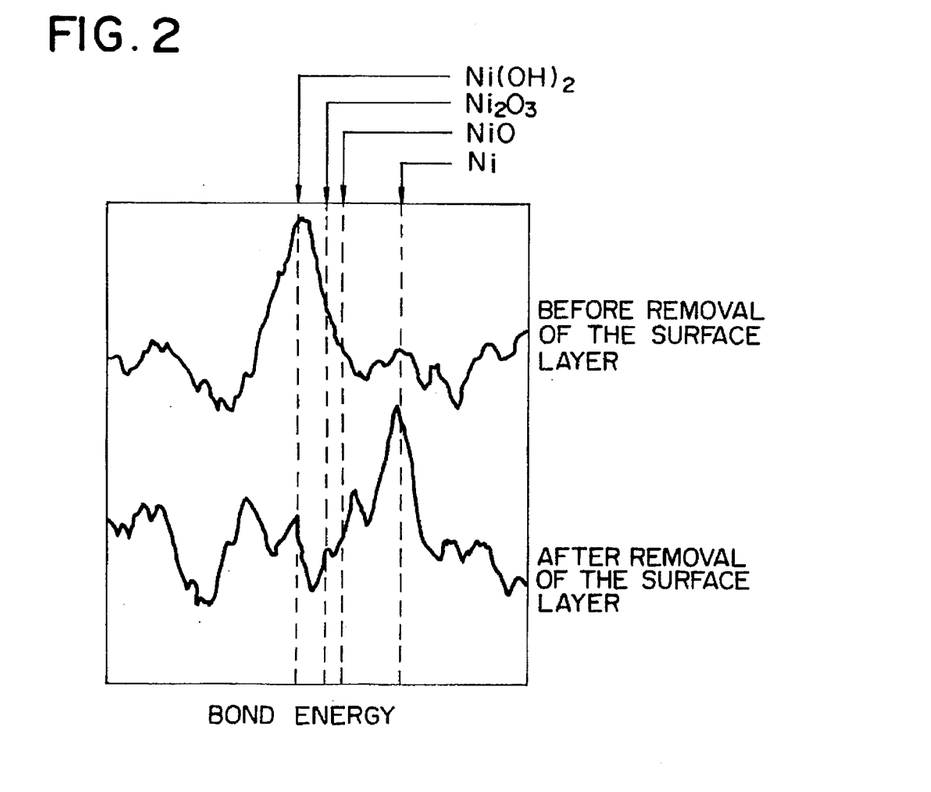
FIG. 2 is a graph showing the results of ESCA of the gold film according to one example of the present invention.

Next, the present inventor has conducted measurements by an ESCA apparatus in order to know the state of the nickel present at the surface layer into which it has diffused. The results are shown in FIG. 2. It has been found that the nickel is present in the form of mainly nickel hydroxide $(Ni(OH)_2)$ or nickel oxide $(Ni_2O_3, NiO)$ as shown in the upper part of FIG. 2. Furthermore, it has also been found that when the surface layer of about 10 nm in thickness of the gold film 2c is cut away by the usual sputtering method with argon gas, the concentration of nickel hydroxide or nickel oxide markedly decreases as shown in the lower part of FIG. 2.

Figure 3:
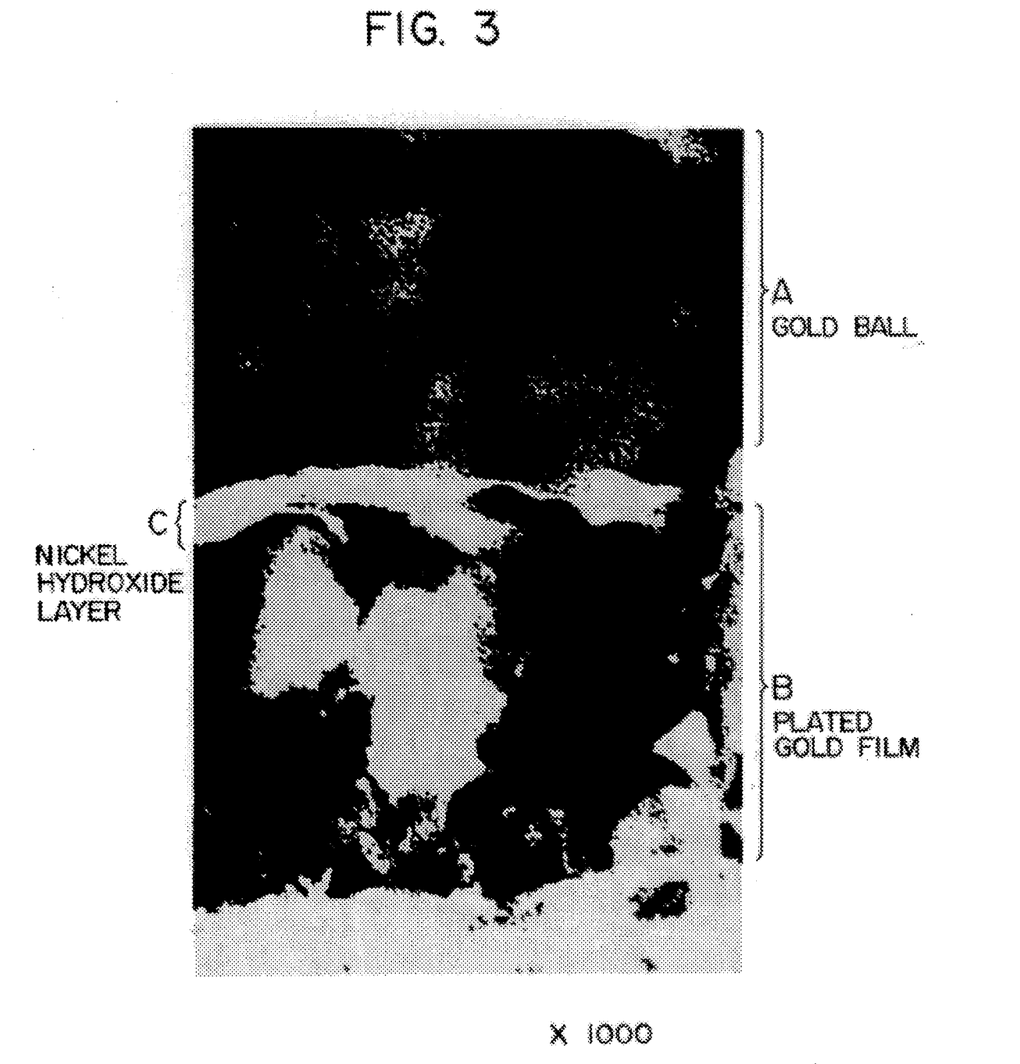
FIG. 3 is an illustration of an electron micrograph of the bonding portion where the wire and the gold film were bonded without removal of the surface layer.

FIG. 3 is an illustration of an electromicrograph (magnification: 1,000,000) of the bonding portion of the gold film 2c and wire 6. In FIG. 3, the blackish part shown by A is the wire 6 and the blackish part shown by B is the gold film 2c. A foreign matter C (which appears whitish) is present at the boundary between them and this foreign matter C is considered to be nickel hydroxide or nickel oxide in view of the above-mentioned data. As a whole, it can be considered that a part of nickel in the nickel layer 2b diffuses into the gold film 2c by the heat treatment conducted in the curing oven 5 and combines with water or other matters contained in the substrate 1 and is present in the form of nickel hydroxide or nickel oxide in the surface layer of the gold film 2c, which hinders the bonding of wire 6 (super-fine gold wire as explained above) to the gold film 2c of the electrode 2 and, as a result, the bond strength at the bonding portion of them decreases. Furthermore, with increase in the thickness of the gold film 2c, the bond strength after the heat treatment decreases with difficulty from the bond strength before the heat treatment and it is considered that this is because even if nickel or its compounds diffuse into the gold film 2c, it can reach the surface layer portion with difficulty due to obstruction by the thick gold film 2c.

Figure 4A:
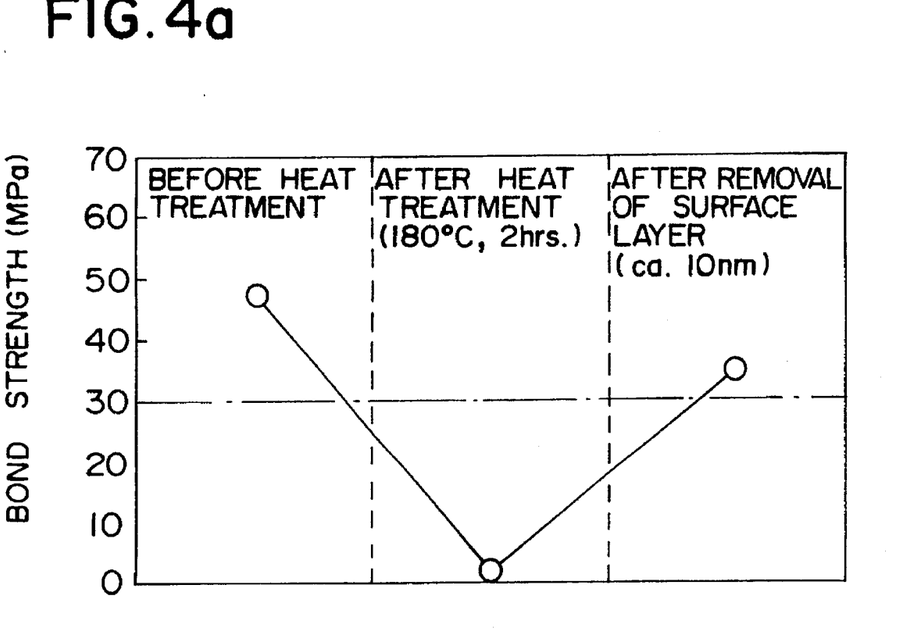
FIG. 4a is a graph comparing the change in the bond strength before and after the heat-treatment, and after the removal of surface layer according to one example of the present invention.
Figure 4B:
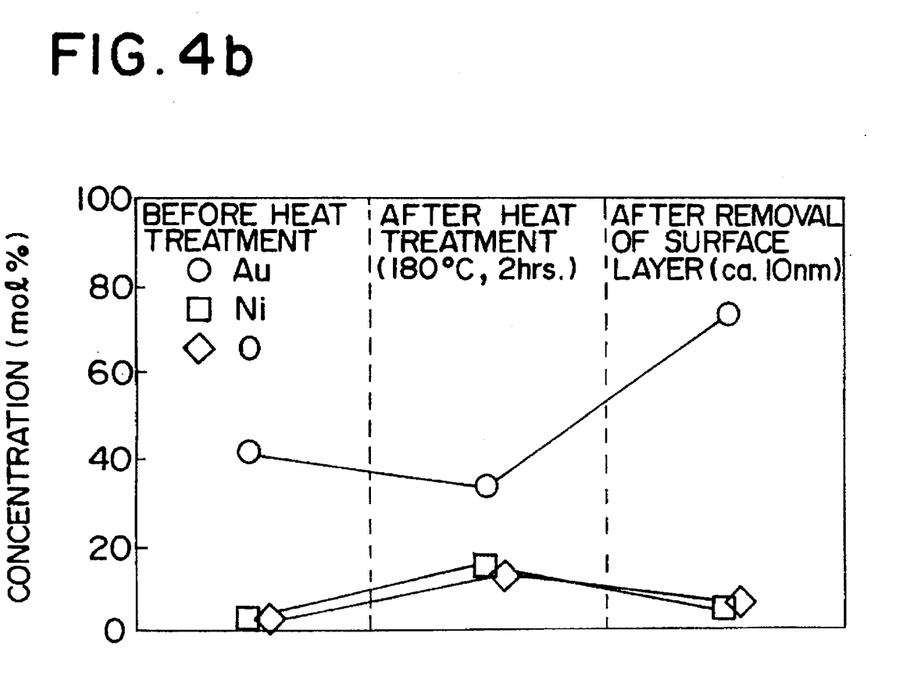
FIG. 4b is a graph comparing the change in the concentration before and after the heat-treatment and after the removal of surface layer according to one example of the present invention.
Figure 5:
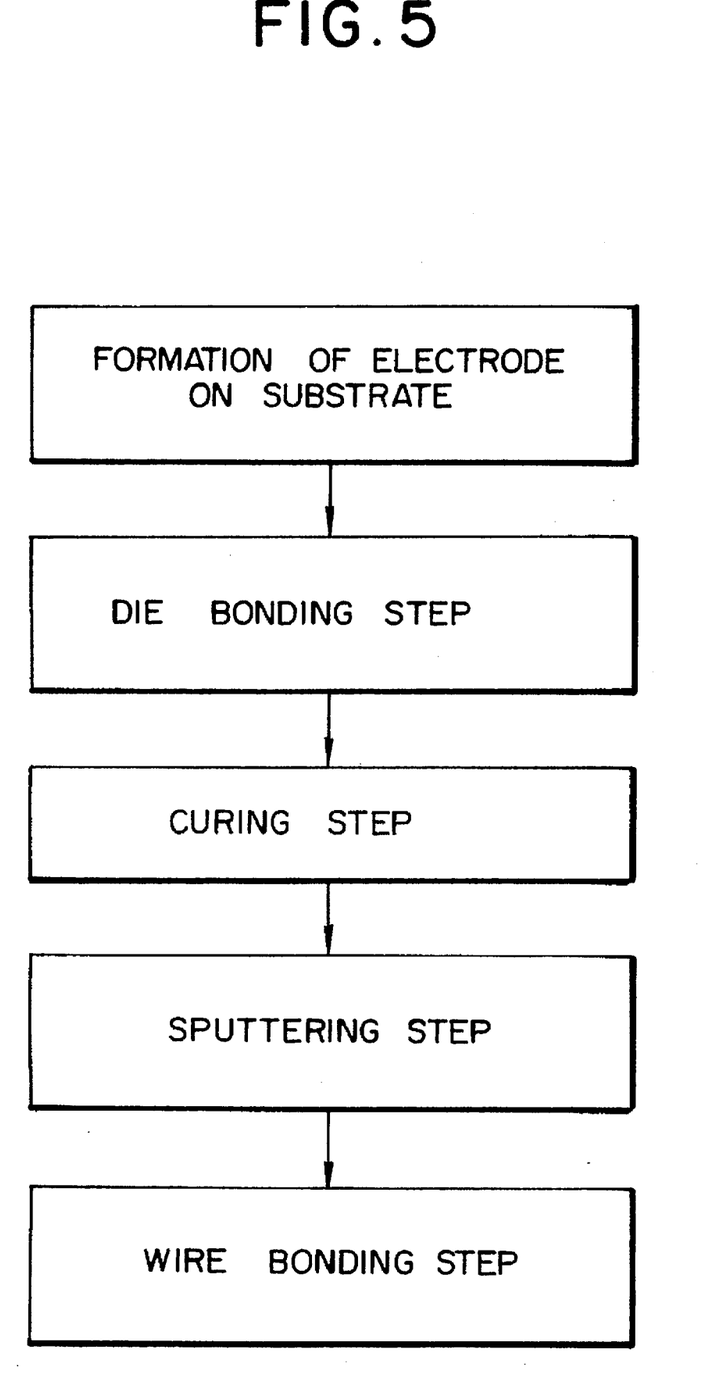
FIG. 5 is a flowchart explaining the wire bonding method according to one example of the present invention.

Furthermore, the present inventor has obtained bond strength of the bonding portion for the electrode 2 where the surface layer of about 10 nm in thickness of the super-thin gold film 2c (0.05 µm thick) formed by the substitution plating method has been removed (as shown in the lower part of FIG. 2) and concentration distribution in the surface layer exposed freshly by the removal of the surface layer. The results are shown in FIGS. 4a and 4b. First, on the bond strength of the bonding portion, it has been found that the bonding portion which has had a sufficient bond strength before the heat treatment considerably loses the bond strength by the heat treatment for 2 hours while when the surface layer is removed, a sufficient bond strength is obtained and can practically be employed as shown in the right column of FIG. 4a. Moreover, as to the concentration distribution in the surface layer, as shown in the right column of FIG. 4b, removal of the surface layer results in decrease of concentration of nickel and that of oxygen and relatively results in increase in the concentration of gold. It is considered that this is because nickel hydroxide $(Ni(OH)_2)$ or nickel oxide $(Ni_2O_3, NiO)$ has been eliminated.

The above experiments were conducted on forming the super-thin gold film 2c (0.05 µm thick) by the substitution plating method which has hitherto been considered to be unsuitable as a method for forming an electrode to be used for wire bonding. As a result, it has been found that even when the the super-thin gold film as above is employed, a sufficient bond strength can be obtained if the nickel hydroxide is eliminated by removing the surface layer. It is a matter of course that even when a thicker gold film is formed by the deoxidation plating method or the electroplating method, the similar effect can be obtained by removal of the surface layer and these plating methods are also included in the present invention.

Figure 6A:
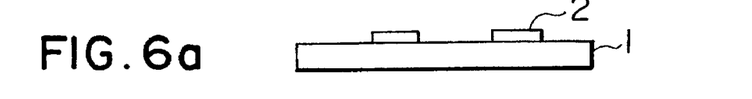
FIGS. 6a, 6b, 6c, 6d, 6e, 6f and 6g are a flowchart illustrating the steps of the wire bonding method according to one example of the present invention.
Figures 6B, 6C:
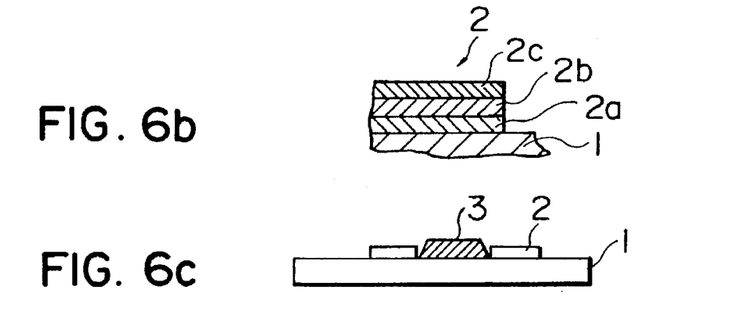
Figure 6D:
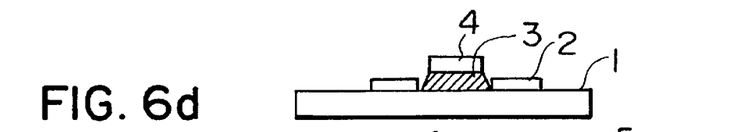
Figure 6E:
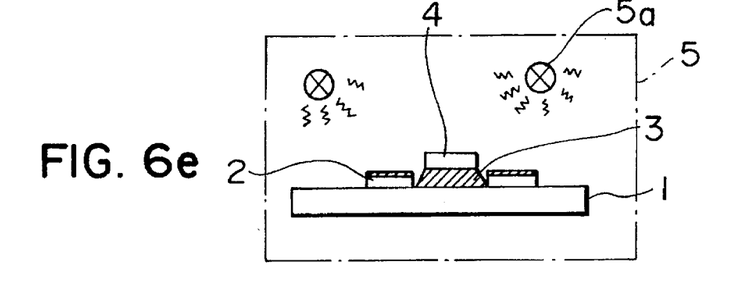
Figure 6F:
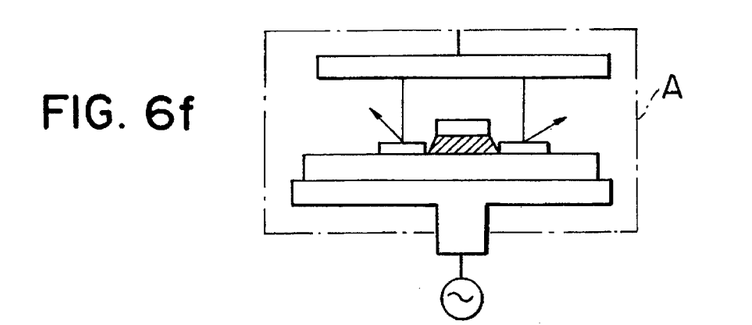
Figure 6G:
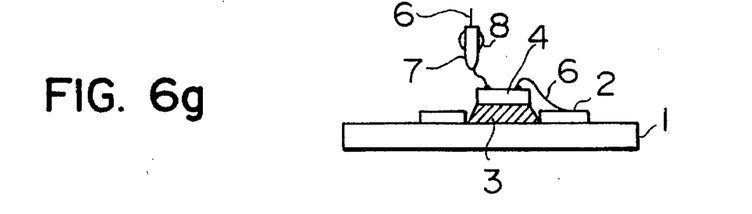
Figure 7:
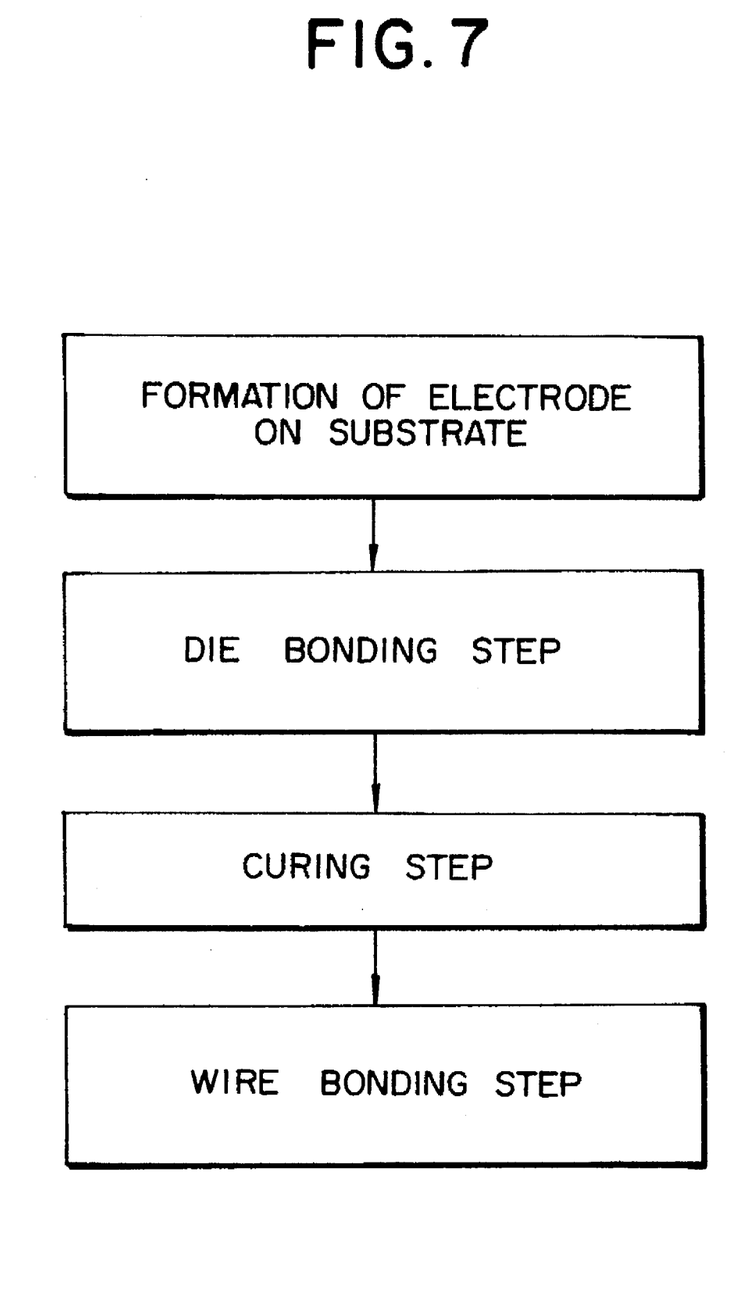
FIG. 7 is a flowchart showing a conventional wire bonding method.

Next, an example of the present invention will be explained referring to FIG. 5 and FIGS. 6a, 6b, 6c, 6d, 6e, 6f and 6g. The example shown in FIG. 5 differs from the conventional means (FIG. 7) in that a sputtering step is present between the curing step and the wire bonding step. That is, as shown in FIG. 6f, in this example, a part of the surface layer of gold film 2c of electrode 2 is removed by a sputtering apparatus A with argon gas, to thereby eliminate the nickel hydroxide or nickel oxide. Thus, a sufficient bond strength can also be obtained by using a thin gold film 2c. The thickness of the surface layer to be removed is most preferably in the range of 3–30 nm in view of the thickness of nickel hydroxide or nickel oxide and the operating efficiency.

According to the present invention, an electrode having a three-layer structure comprising a copper layer, a nickel layer and a gold film is formed on a substrate and a thin surface layer of the electrode is removed to eliminate the nickel hydroxide or nickel oxide prior to the wire bonding. As a result, a sufficient bond strength can be obtained even in the case of a thin gold film and the costs can be reduced.

What is claimed is:

1. A wire bonding method of electrically connecting through an electrically conductive wire an electrode on a substrate to a pad of a semiconductor chip fixed with a bonding agent on the substrate, said electrode comprising a copper layer and a nickel layer formed on the copper layer and coated with gold, comprising the steps of subjecting said electrode to heat treatment, thereby forming a thin superficial layer comprising nickel hydroxide and nickel oxide deposited on said gold, and removing said thin superficial layer from the coated layer of said gold, followed by electrically connecting the electrode to the pad.

2. The method according to claim 1, wherein the removal of said thin superficial layer is carried out by sputtering said electrode having said thin superficial layer thereon.

3. The method according to claim 1, wherein said thin superficial layer to be removed is 3–30 nm thick.

4. The method according to claim 2, wherein said thin superficial layer to be removed is 3–30 nm thick.

5. A wire bonding method comprising the steps of coating an adhesive on a substrate on which has been formed an electrode having a three-layer structure comprising a copper layer, nickel layer and gold layer; mounting a semiconductor chip on said adhesive; curing said adhesive in a curing oven; removing a thin superficial layer comprising nickel hydroxide and nickel oxide from the gold layer; and electrically connecting a pad of the semiconductor chip through an electrically conductive wire to the electrode at an area of the gold layer from which has been removed said thin superficial layer.

6. The method according to claim 5, wherein the removal of said thin superficial layer is carried out by sputtering said electrode having said thin superficial layer thereon.

7. The method according to claim 5, wherein said thin superficial layer to be removed is 3–30 nm thick.

8. The method according to claim 6, wherein said thin superficial layer to be removed is 3–30 nm thick.

* * * * *